(12) United States Patent
Watanabe

(10) Patent No.: US 10,211,864 B2
(45) Date of Patent: *Feb. 19, 2019

(54) RADIO-FREQUENCY MODULE AND COMMUNICATION DEVICE

(71) Applicant: Murata Manufacturing Co., Ltd., Nagaokakyo-shi, Kyoto-fu (JP)

(72) Inventor: Takashi Watanabe, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/851,902

(22) Filed: Dec. 22, 2017

(65) Prior Publication Data
US 2018/0123628 A1 May 3, 2018

Related U.S. Application Data

(63) Continuation of application No. 15/296,126, filed on Oct. 18, 2016, now Pat. No. 9,887,718.

(30) Foreign Application Priority Data

Nov. 18, 2015 (JP) .................. 2015-226034

(51) Int. Cl.
*H04B 1/18* (2006.01)
*H04B 1/16* (2006.01)
(Continued)

(52) U.S. Cl.
CPC .............. *H04B 1/16* (2013.01); *H03H 7/38* (2013.01); *H03H 9/64* (2013.01); *H03H 9/72* (2013.01);
(Continued)

(58) Field of Classification Search
CPC .......... H03H 11/362; H03H 2007/386; H03H 2250/00; H03H 7/38; H03H 9/64; H03H 9/72; H04B 1/16
(Continued)

(56) References Cited

U.S. PATENT DOCUMENTS

2006/0163659 A1* 7/2006 Asano ................ H01L 27/0251
257/357
2011/0121852 A1* 5/2011 Horii .................. G01R 31/2889
324/756.03
(Continued)

FOREIGN PATENT DOCUMENTS

JP 2014-207517 A 10/2014

OTHER PUBLICATIONS

Watanabe, "Radio-Frequency Module and Communication Device", U.S. Appl. No. 15/296,126, filed Oct. 18, 2016.

*Primary Examiner* — Tan H Trinh
(74) *Attorney, Agent, or Firm* — Keating & Bennett, LLP

(57) ABSTRACT

A radio-frequency module includes a multilayer substrate, an input switch, an output switch, and filters. A switch IC is disposed on a main surface of the multilayer substrate. The input switch is disposed in the switch IC and includes a first input terminal and first output terminals. The output switch is disposed in the switch IC and includes second input terminals and a second output terminal. The filters are disposed outside the switch IC and are connected to the first output terminals and the second input terminals. In a plan view of the multilayer substrate, the first input terminal and the first output terminals are disposed close to a first side of an exterior of the switch IC, and the second input terminals and the second output terminal are disposed close to a second side different from the first side of the exterior of the switch IC.

19 Claims, 11 Drawing Sheets

(51) Int. Cl.
   *H03H 7/38*      (2006.01)
   *H03H 9/64*      (2006.01)
   *H03H 9/72*      (2006.01)
   *H03H 11/36*     (2006.01)

(52) U.S. Cl.
   CPC ..... *H03H 11/362* (2013.01); *H03H 2007/386* (2013.01); *H03H 2250/00* (2013.01)

(58) Field of Classification Search
   USPC ........... 455/77, 78, 168.1, 188.1, 101, 114.3, 455/306, 370, 333, 334, 191.3; 370/278; 333/187, 167, 193; 327/434
   See application file for complete search history.

(56) References Cited

U.S. PATENT DOCUMENTS

| | | | |
|---|---|---|---|
| 2012/0038411 A1* | 2/2012 | Sugiura .............. | H03K 17/6874 327/434 |
| 2012/0163247 A1* | 6/2012 | Shimamoto ............ | H04B 1/006 370/278 |
| 2013/0069742 A1* | 3/2013 | Yasuda .................... | H03H 9/64 333/193 |
| 2014/0308906 A1 | 10/2014 | Saji et al. | |
| 2017/0077982 A1* | 3/2017 | Obkircher .............. | H04B 1/401 |

* cited by examiner

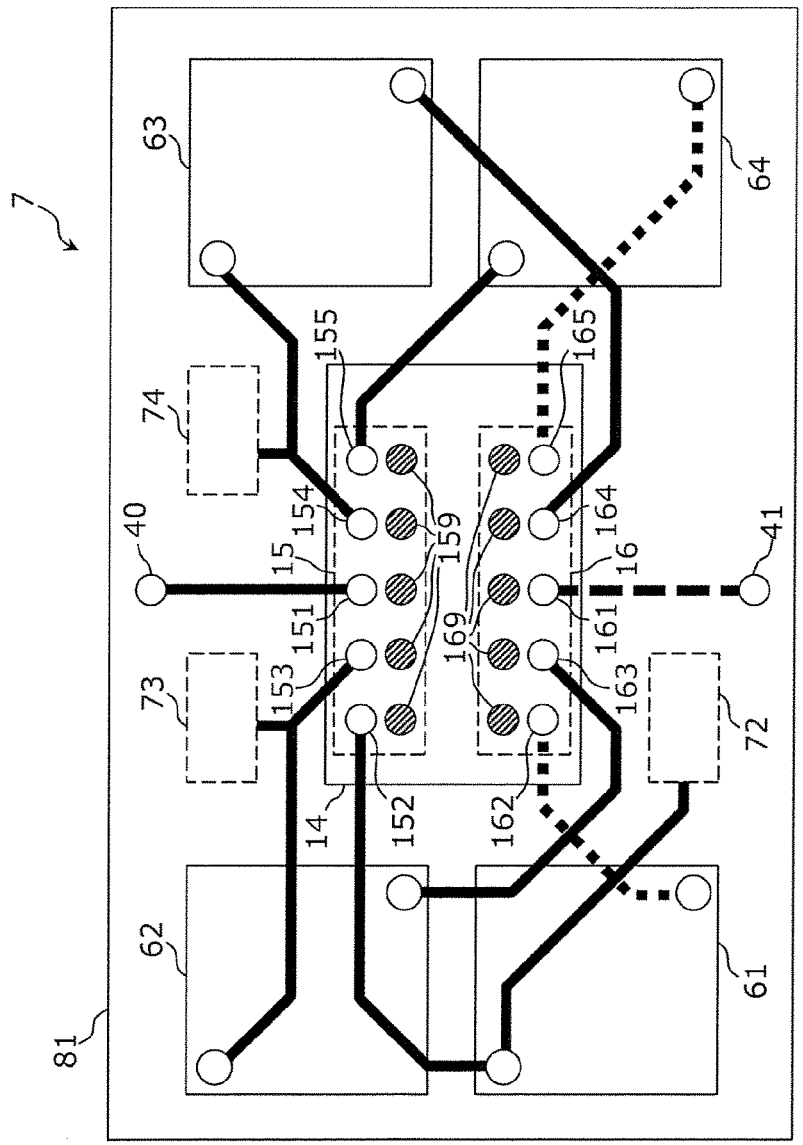

RADIO-FREQUENCY MODULE AND COMMUNICATION DEVICE

CROSS REFERENCE TO RELATED APPLICATIONS

This application claims the benefit of priority to Japanese Patent Application 2015-226034 filed on Nov. 18, 2015, the entire contents of which are hereby incorporated herein by reference.

BACKGROUND OF THE INVENTION

1. Field of the Invention

The present invention relates to a radio-frequency module and a communication device.

2. Description of the Related Art

In the related art, in order to obtain sufficient isolation between input and output sides, the following configuration of a radio-frequency amplifier circuit is known. An input stripline and an output stripline are disposed on different layers of a multilayer substrate between which a ground layer is sandwiched (for example, see Japanese Unexamined Patent Application Publication No. 6-334449).

Nowadays, so-called multiband communication devices that perform communication by selectively using multiple frequency bands (hereinafter simply referred to as "bands") are available. In such a communication device, a radio-frequency module including plural signal paths for different bands and a switch for selecting one of the plural signal paths is used. In addition to this switch, many circuit elements including a filter element and a matching element for each of the signal paths may be mounted on the radio-frequency module. As the radio-frequency module is being decreased in size and increased in performance, the mounting density of circuit elements is becoming higher. At the same time, the need to secure isolation between an input terminal and an output terminal is also increased.

SUMMARY OF THE INVENTION

Accordingly, preferred embodiments of the present invention provide a radio-frequency module exhibiting high isolation between an input terminal and an output terminal and a communication device including such a radio-frequency module.

According to a preferred embodiment of the present invention, a radio-frequency module includes a substrate, an input switch, an output switch, and a filter. A switch region is provided on a main surface of the substrate. The input switch is disposed in the switch region of the substrate and includes a first input terminal and a first output terminal. The output switch is disposed in the switch region of the substrate and includes a second input terminal and a second output terminal. The filter is disposed outside the switch region of the substrate and is connected to the first output terminal and the second input terminal. In a plan view of the substrate, the first input terminal and the first output terminal are disposed close to a first side of the switch region, and the second input terminal and the second output terminal are disposed close to a second side, which is different from the first side, of the switch region.

In this description, the phrase "a certain terminal is disposed close to a certain side of a switch region" means that a distance between the certain terminal and the certain side is shorter than distances between the certain terminal and the other sides of the switch region.

With this configuration, the first input terminal and the first output terminal of the input switch are disposed close to one side of the switch region, while the second input terminal and the second output terminal of the output switch are disposed close to another side of the switch region. Accordingly, even if the size of the switch region is reduced in accordance with a decrease in the size of the radio-frequency module, the first input terminal and the first output terminal of the input switch and the second input terminal and the second output terminal of the output switch are more likely to be separated from each other. It is thus possible to significantly reduce or prevent the deterioration of isolation which would be caused by the arrangement in which the terminals of the input switch and the terminals of the output switch are disposed close to each other.

In a plan view of the substrate, the second output terminal may be disposed farther inward than the second input terminal in the switch region.

In this description, the phrase "a certain terminal is disposed farther inward" indicates that the certain terminal is located farther from the peripheral sides of the substrate, in a plan view of the substrate.

With this configuration, it is possible to avoid a situation where the second input terminal and the second output terminal are densely arranged on the peripheral sides of the switch region. It is thus possible to significantly reduce or prevent the deterioration of isolation which would be caused by the arrangement in which the second input terminal and the second output terminal are disposed close to each other.

In a plan view of the substrate, a ground terminal may be disposed between the first output terminal and the second output terminal.

With this configuration, it is possible to significantly reduce or prevent the deterioration of isolation between the first output terminal and the second output terminal due to the electromagnetic shielding effect exhibited by the ground terminal.

The output switch may include a plurality of output switches. Each of the plurality of output switches includes the second input terminal and the second output terminal. Concerning different first and second output switches of the plurality of output switches, in a plan view of the substrate, the second input terminal and the second output terminal of the first output switch may be disposed close to one side of the switch region, and the second input terminal and the second output terminal of the second output switch may be disposed close to another side of the switch region.

With this configuration, it is possible to significantly reduce or prevent the deterioration of isolation which would be caused by the arrangement in which the terminals of the first output switch and the terminals of the second output switch are disposed close to each other.

The substrate may be a multilayer substrate including first and second wiring layers. A wiring pattern connected to at least one of the first input terminal, the first output terminal, and the second input terminal may be disposed on the first wiring layer. A wiring pattern connected to the second output terminal may be disposed on the second wiring layer. A ground conductor may be disposed between the first and second wiring layers.

With this configuration, it is possible to significantly reduce or prevent the deterioration of isolation between the second output terminal and each of the first input terminal, the first output terminal, and the second input terminal due to the electromagnetic shielding effect exhibited by the ground conductor.

The second output terminal may include a plurality of second output terminals. The radio-frequency module may further include a plurality of wiring patterns that are connected to different second output terminals of the plurality of second output terminals and extend in different directions.

With this configuration, it is possible to significantly reduce or prevent the deterioration of isolation between the plurality of second output terminals.

The input switch and the output switch may include a single semiconductor chip disposed at or substantially at the center of the substrate. The switch region may be defined by an outer configuration of the semiconductor chip. The filter may be disposed in a region which surrounds the semiconductor chip, in a plan view of the substrate.

With this configuration, plural wiring patterns are disposed radially or substantially radially between the semiconductor chip and the filter. Accordingly, the plural wiring patterns are more likely to be separated from each other by a sufficient distance, thus significantly reduce or preventing the deterioration of isolation between the plural wiring patterns.

According to a preferred embodiment of the present invention, a communication device includes the above-described radio-frequency module and a radio-frequency integrated circuit connected to the radio-frequency module.

With this configuration, by using the radio-frequency module in which the deterioration of the above-described various kinds of isolation is significantly reduced or prevented, it is possible to obtain a communication device exhibiting excellent signal characteristics.

According to preferred embodiments of the present invention, it is possible to obtain a radio-frequency module exhibiting high isolation between an input terminal and an output terminal and a communication device using such a radio-frequency module.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8 is a plan view illustrating an example of the arrangement of components of the front-end module according to the second preferred embodiment of the present invention.

DETAILED DESCRIPTION OF THE PREFERRED EMBODIMENTS

Figure 1A:
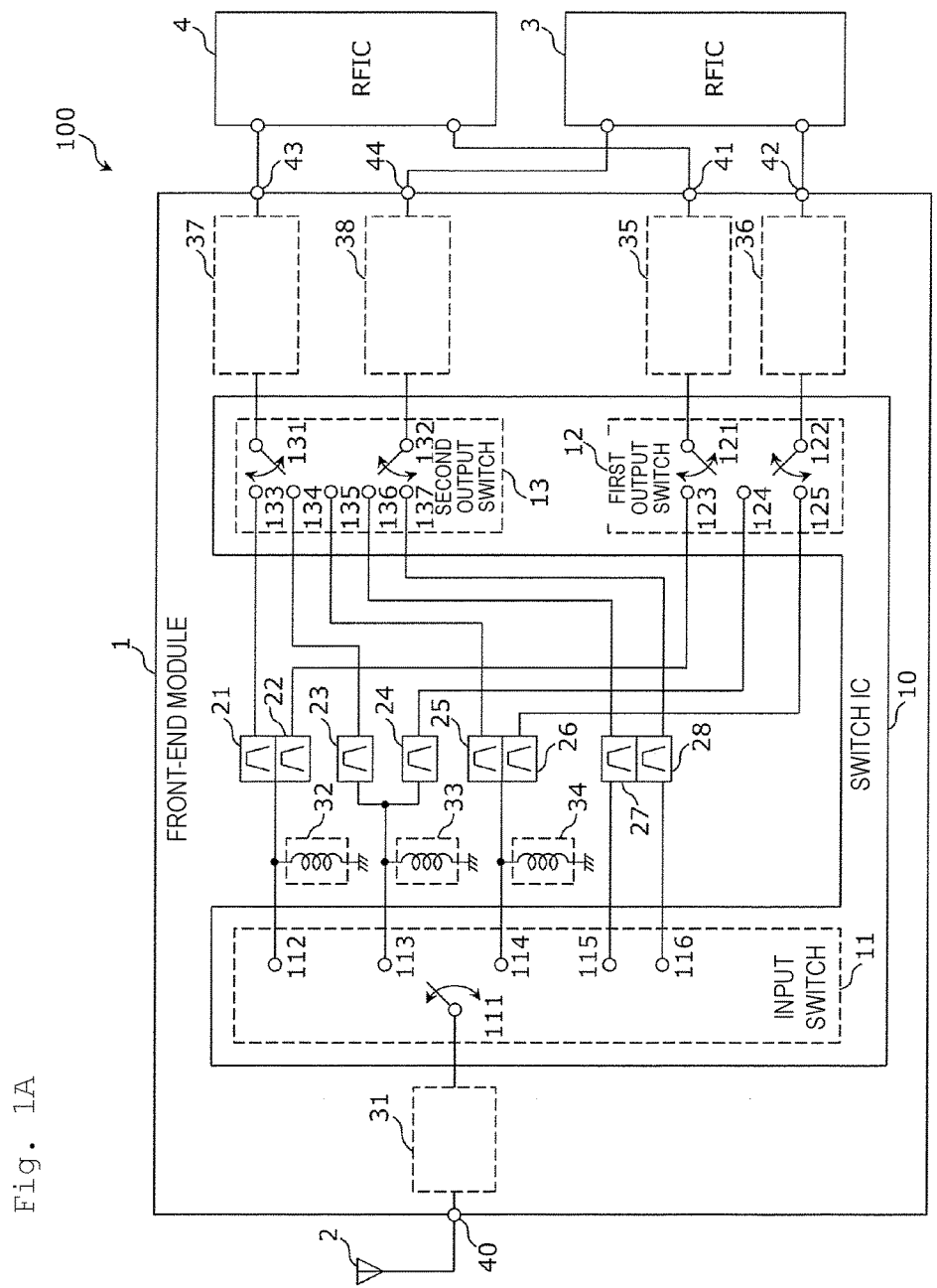
FIG. 1A is a circuit diagram illustrating an example of the circuit configuration of a front-end module according to a first preferred embodiment of the present invention.

Preferred embodiments of the present invention will be described below in detail with reference to the accompanying drawings. All of the preferred embodiments described below illustrate general or specific examples. Numeric values, configurations, materials, components, and positions and connection states of the components illustrated in the following preferred embodiments are only examples, and do not limit the present invention. Among the components illustrated in the following preferred embodiments, the components that are not recited in the independent claims which embody the broadest concept of the present invention will be described as optional components. The sizes and dimensional ratios of the components in the drawings are not necessarily illustrated as actual sizes and ratios.

First Preferred Embodiment

A radio-frequency module according to a first preferred embodiment of the present invention includes plural signal paths and switches that select one of the plural signal paths. The radio-frequency module is, for example, a front-end module used in a multiband communication device such as a cellular phone.

FIG. 1A is a circuit diagram illustrating an example of the circuit configuration of a front-end module 1 according to the first preferred embodiment. In FIG. 1A, as the major portion of a cellular phone 100, an antenna 2 and radio-frequency integrated circuits (RFICs) 3 and 4 are shown, together with the front-end module 1.

In FIG. 1A, the antenna 2 receives a radio signal in which signal components of multiple bands are superimposed on each other, and supplies the received radio signal to the front-end module 1. The antenna 2 preferably is, for example, a chip antenna or a wiring conductor on a substrate.

The front-end module 1 separates signals of multiple bands from the radio signal received from the antenna 2, and supplies a maximum of four signals selected from among the separated signals to the RFICs 3 and 4 in parallel. The front-end module 1 preferably includes, for example, a multilayer substrate on which various circuit elements are mounted.

The RFICs 3 and 4 are circuit elements that amplify and demodulate signals supplied from the front-end module 1. Each of the RFICs 3 and 4 is preferably defined by a one-chip IC including a low-noise amplifier and a demodulator, for example.

The signals demodulated by the RFICs 3 and 4 are decoded and are subjected to digital-to-analog (DA) conversion in a baseband IC (not shown), and are used for data communication and speech communication.

In the cellular phone 100, in association with the above-described receive side block, a transmit side block which performs DA conversion, coding, modulation, and amplification is provided, though a detailed explanation thereof will be omitted.

With the above-described configuration, the cellular phone 100 preferably is a multiband communication device that implements carrier aggregation in which communication is performed by using a maximum of four bands in parallel.

The front-end module 1 will be described below in detail.

As shown in FIG. 1A, the front-end module 1 includes a switch IC 10, filters 21 through 28, matching circuits 31 through 38, and terminals 40 through 44.

The terminal 40 receives a radio signal from the antenna 2. It is assumed that this radio signal includes signals of five bands which belong to a first band group and signals of three bands which belong to a second band group. The bands in the first and second band groups are bands operating in multiband communication.

The switch IC 10 preferably is a one-chip IC including an input switch 11 and first and second output switches 12 and 13, for example. The connection states of the input switch 11 and the first and second output switches 12 and 13 are changed in the following manner in accordance with a selection signal received by a control terminal (not shown).

The input switch 11 includes terminals 111 through 116, and connects the terminal 111 to at least one terminal selected from the terminals 112 through 116. The terminal 111 is an example of a first input terminal, while the terminals 112 through 116 are examples of a first output terminal.

The first output switch 12 includes terminals 121 through 125. The first output switch 12 connects the terminal 121 to one terminal selected from the terminals 123 through 125 or does not connect the terminal 121 to any of the terminals 123 through 125. The first output switch 12 also connects the terminal 122 to one terminal selected from the terminals 123 through 125 or does not connect the terminal 122 to any of the terminals 123 through 125.

The second output switch 13 includes terminals 131 through 137. The second output switch 13 connects the terminal 131 to one terminal selected from the terminals 133 through 137 or does not connect the terminal 131 to any of the terminals 133 through 137. The second output switch 13 also connects the terminal 132 to one terminal selected from the terminals 133 through 137 or does not connect the terminal 132 to any of the terminals 133 through 137.

The terminals 123 through 125 and 133 through 137 are examples of a second input terminal, while the terminals 121, 122, 131, and 132 are examples of a second output terminal.

The filters 22, 24, and 26 preferably are band pass filters which allow signals of different bands belonging to the first band group to pass therethrough, and are connected to the associated output terminals of the input switch 11 and to the associated input terminals of the first output switch 12.

The filters 21, 23, 25, 27, and 28 preferably are band pass filters which allow signals of different bands belonging to the second band group to pass therethrough, and are connected to the associated output terminals of the input switch 11 and to the associated input terminals of the second output switch 13.

The filters 21 and 22 preferably include a filter component in which two filter elements are stored in one package and a common input terminal for the two filter elements is provided. The filters 25 and 26 are also structured in a similar manner. The filter 23 preferably is a filter component in which a single filter element is stored in one package. The filter 24 is also structured in a similar manner. The filters 27 and 28 preferably include a filter component in which two filter elements are stored in one package and input/output terminals for each filter element are provided. Each of the filter elements 21 through 28 may be a surface acoustic wave (SAW) filter, for example. The configurations of the filter components are not restricted to the above-described examples, and a filter component configured in an appropriate manner to achieve a desired filter characteristic may be used.

The matching circuit 31 is disposed on a signal path between the terminals 40 and 111.

The matching circuit 32 is disposed on a signal path between the terminals 112 and the filters 21 and 22.

The matching circuit 33 is disposed on a signal path between the terminals 113 and the filters 23 and 24.

The matching circuit 34 is disposed on a signal path between the terminals 114 and the filters 25 and 26.

The matching circuit 35 is disposed on a signal path between the terminals 121 and 41.

The matching circuit 36 is disposed on a signal path between the terminals 122 and 42.

The matching circuit 37 is disposed on a signal path between the terminals 131 and 43.

The matching circuit 38 is disposed on a signal path between the terminals 132 and 44.

The configurations of the matching circuits 31 through 38 are not particularly restricted. The matching circuit 31 may be a two-element matching circuit, for example. Each of the matching circuits 32, 33, and 34 may be defined by one inductor. Each of the matching circuits 35 through 38 may be a three-element matching circuit.

Figure 1B:
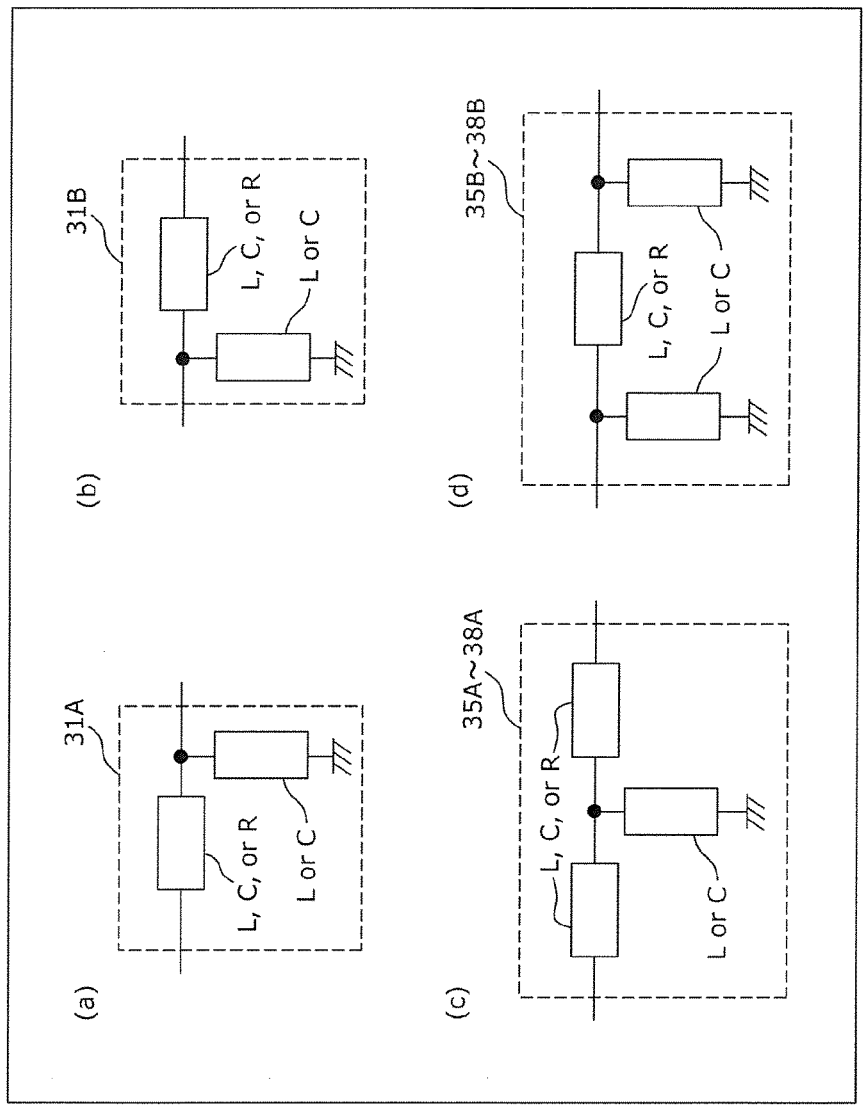
FIG. 1B shows circuit diagrams illustrating examples of matching circuits in the first preferred embodiment of the present invention.

FIG. 1B shows circuit diagrams illustrating examples of the matching circuits 31 and 35 through 38. The matching circuit 31 may be a matching circuit 31A (indicated by (a) of FIG. 1B) or a matching circuit 31B (indicated by (b) of FIG. 1B) defined by one inductor, one capacitor, or one resistor and one inductor or one capacitor.

The matching circuits 35 through 38 may be matching circuits 35A through 38A, respectively, (indicated by (c) of FIG. 1B) defined by two inductors, two capacitors, or two resistors and one inductor or one capacitor. The matching circuits 35 through may be matching circuits 35B through 38B, respectively, (indicated by (d) of FIG. 1B) defined by one inductor, one capacitor, or one resistor and two inductors or two capacitors.

In the front-end module 1 configured as described above, signals of individual bands are separated by the filters 21 through 28 from a multiband signal received by the terminal 40. A maximum of four signals preferably are selected from among the separated signals in accordance with the connection states of the input switch 11 and the first and second output switches 12 and 13, and are output to the terminals 41 through 44 in parallel.

In the circuit diagram of FIG. 1A, the components and wiring patterns of the front-end module 1 are arranged in a simple, ordered manner. However, the actual arrangement of terminals and wiring patterns may be more complicated. For example, some terminals may be disposed in close proximity, or some wiring patterns may cross each other, which are not shown in the circuit diagram. Such a complicated arrangement of terminals and wiring patterns may cause the deterioration of isolation between signal paths. As the front-end module 1 is being decreased in size and increased in performance, the mounting density of circuit elements is becoming higher. Accordingly, it is more likely that terminals and wiring patterns will be disposed in a more complicated manner. At the same time, the need to secure the isolation between signal paths (between an input terminal and an output terminal and between wiring patterns) is increased.

As a result of carrying out extensive study of the arrangement of components of the front-end module 1, the present inventor has conceived a distinctive arrangement of components that is less likely to cause the deterioration of isolation between signal paths. This distinctive arrangement of components will be described below in detail.

Figure 2:
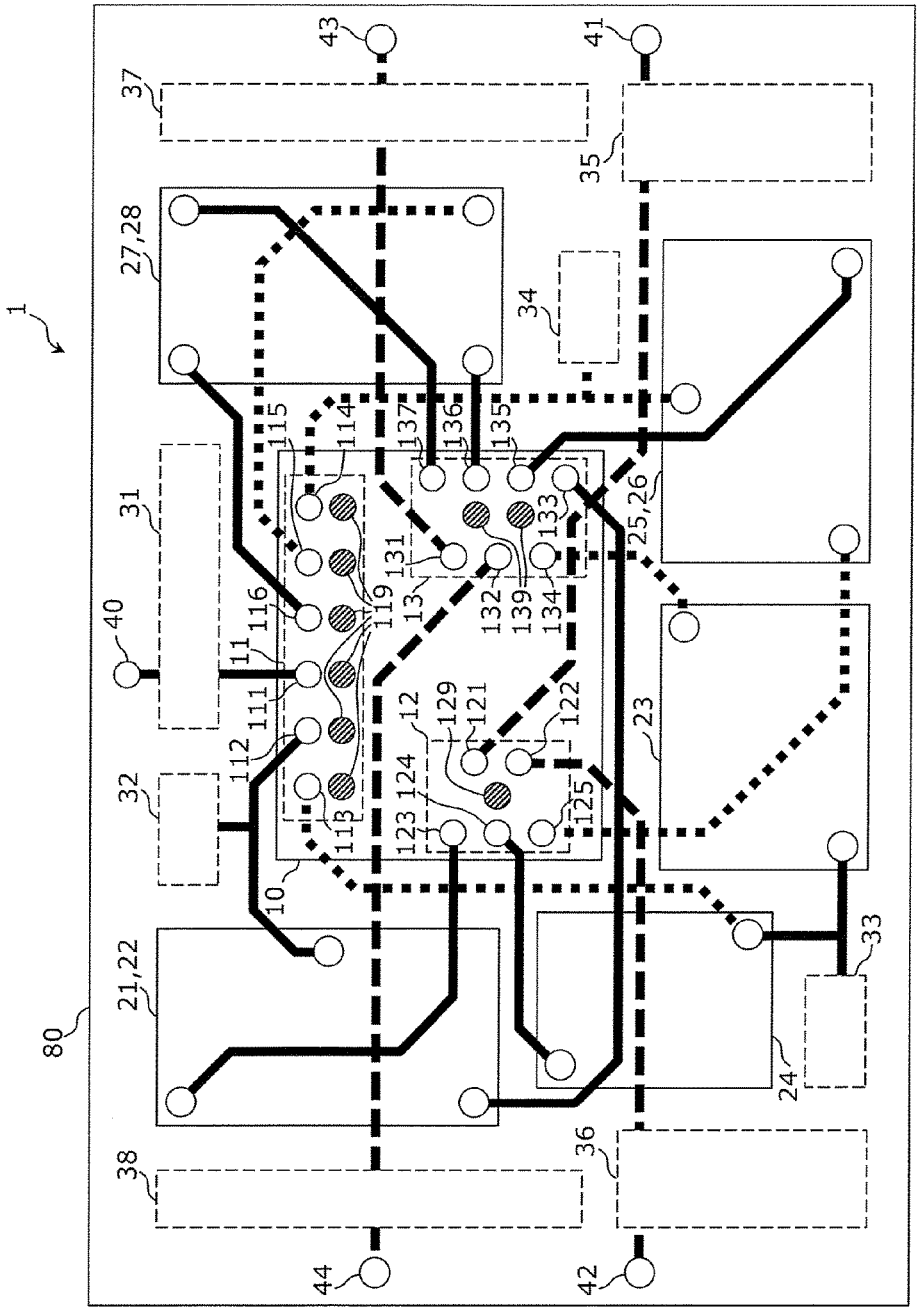
FIG. 2 is a plan view illustrating an example of the arrangement of components of the front-end module according to the first preferred embodiment of the present invention.

FIG. 2 is a plan view illustrating an example of the arrangement of components of the front-end module 1. In the front-end module 1, the switch IC 10, filter components of the filters 21 through 28, and resistors, inductors, and capacitors of the matching circuits 31 through 38 are mounted on the upper main surface of a multilayer substrate 80.

In FIG. 2, in a plan view of the multilayer substrate 80, the outer configurations (outlines) of the switch IC 10 and the filter components are represented by the frames in the solid lines, while the regions where the matching circuits 31 through 38 are located are represented by the frames in the dashed lines. The outer configuration of the switch IC 10 is an example of a switch region.

In FIG. 2, by assuming the general outer configuration of a one-chip IC, a rectangular or substantially rectangular switch region is shown. However, the switch region is not restricted to a rectangle, but may be a polygon.

Instead of being integrated into the switch IC 10, which is a one-chip IC, each of the input switch 11 and the first and second output switches 12 and 13 may be a switch IC. In FIG. 2, the frames in the dashed lines within the switch region represent the outer configurations of the individual switch ICs of the input switch 11 and the first and second output switches 12 and 13, while the frame in the solid line represents the switch region of the switch IC 10.

In FIG. 2, the positions of the terminals of the input switch 11 and the first and second output switches 12 and 13 are expressed by the same symbols as those in FIG. 1A. Terminals 119, 129, and 139 indicated by the hatched portions are respectively ground terminals of the input switch 11 and the first and second output switches 12 and 13, and are not shown in FIG. 1A.

In FIG. 2, the routes of the plural wiring patterns shown in FIG. 1A are indicated by the thick lines. The line types (thick solid lines, thick dotted lines, and thick dashed lines) are used to distinguish between layers on which the wiring patterns are disposed. That is, the plural wiring patterns are disposed on at least three wiring layers of the multilayer substrate 80. One of the three wiring layers may be the upper main surface of the multilayer substrate 80. The wiring patterns disposed on the inner layers are connected to the terminals on the upper main surface with via-holes.

Figure 3:
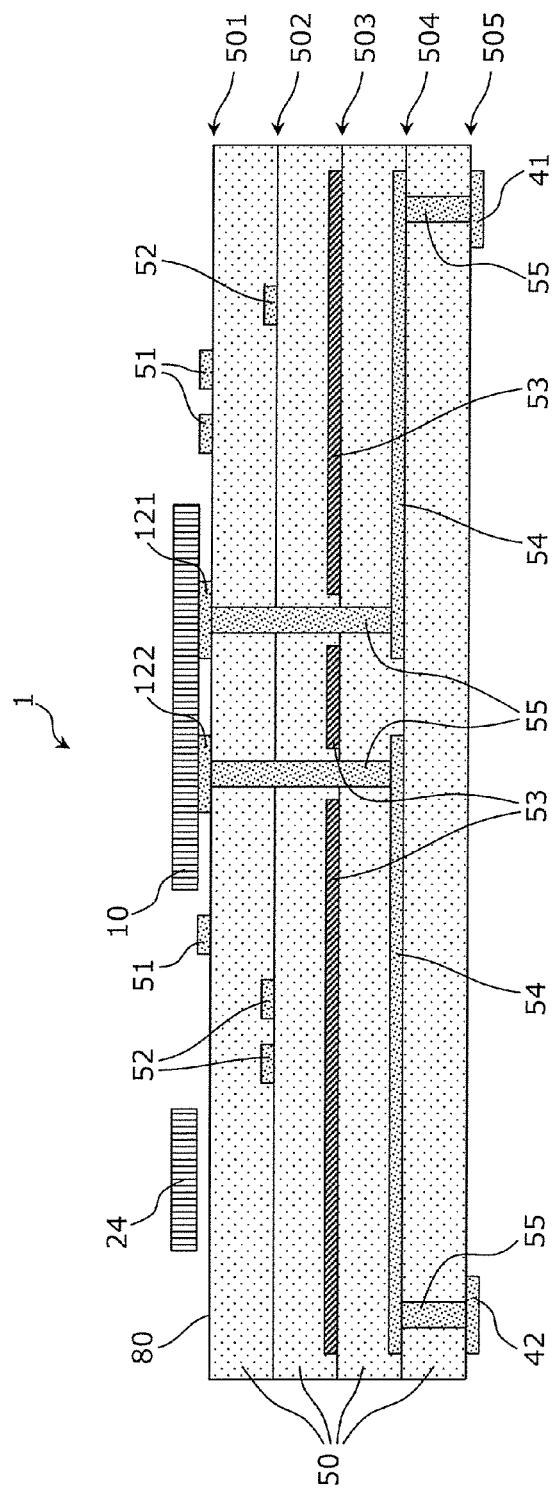
FIG. 3 is a sectional view illustrating an example of the structure of a cross section of the front-end module according to the first preferred embodiment of the present invention.

FIG. 3 is a sectional view illustrating an example of the structure of a cross section of the front-end module 1. More specifically, FIG. 3 shows a cross section of the front-end module 1 taken along a surface including a wiring pattern which connects the terminals 42 and 122 and a wiring pattern which connects the terminals 41 and 121 shown in FIG. 2.

As shown in FIG. 3, the multilayer substrate 80 preferably includes four base layers 50 stacked on each other. As the layers on which wiring conductors can be disposed, the multilayer substrate 80 includes an upper main surface 501 and a lower main surface 505 exposed to the exterior and boundary surfaces 502, 503, and 504, each being positioned between adjacent base layers 50.

On the upper main surface 501, the terminals 121 and 122 and wiring patterns 51 are disposed. The wiring patterns 51 correspond to the thick solid lines in FIG. 2. The switch IC 10 is mounted on the upper main surface 501, with the terminals 121 and 122 and terminals in another cross section, which is not shown in FIG. 3. The filter 24 is mounted on the upper main surface 501, with terminals in another cross section, which is not shown in FIG. 3.

On the lower main surface 505, the terminals 41 and 42 are disposed.

On the boundary surface 502, wiring patterns 52 are disposed. The wiring patterns 52 correspond to the thick dotted lines in FIG. 2.

On the boundary surface 504, wiring patterns 54 are disposed. The wiring patterns 54 correspond to the thick dashed lines in FIG. 2.

On the boundary surface 503 between the boundary surfaces 502 and 504, ground conductors 53 are disposed. A reference voltage (ground voltage) of the front-end module 1 is applied to the ground conductors 53. The ground conductors 53 are defined by wider patterns than the wiring patterns 51, 52, and 54, or by solid, or whole film.

The wiring pattern 54 is connected to the terminals 41, 42, 121, and 122 with via holes 55.

The upper main surface 501 and the boundary surface 502 are examples of a first wiring layer, while the boundary surface 504 is an example of a second wiring layer.

Advantages of the front-end module 1 configured as described above will be discussed below.

On the upper main surface 501 of the multilayer substrate 80, a substantially polygonal (for example, substantially rectangular) switch region (for example, the outer configuration of the switch IC 10) is disposed. In a plan view of the multilayer substrate 80, the first input terminal (terminal 111) and the first output terminals (terminals 112 through 116) are disposed close to a first side (top side in FIG. 2) of the switch region. The second input terminals (terminals 123 through 125 and 133 through 137) and the second output terminals (terminals 121, 122, 131, and 132) are disposed close to a second side (one of the right, left, and bottom sides in FIG. 2) of the switch region. The second side is different from the first side.

In this description, the meaning of "a certain terminal is disposed close to a certain side of a switch region" is that a distance between the certain terminal and the certain side is less than distances between the certain terminal and other sides of the switch region.

With this configuration, the terminals of the input switch 11 are disposed close to one side of the switch region, while the terminals of the first and second output switches 12 and are disposed close to another side of the switch region. Accordingly, even if the size of the switch region is reduced in accordance with a decrease in the size of the front-end module 1, the terminals of the input switch 11 and the terminals of the first and second output switches 12 and 13 are more likely to be separated from each other. It is thus possible to significantly reduce or prevent the deterioration of isolation which would be caused by the arrangement in which the terminals of the input switch 11 and the terminals of the first and second output switches 12 and 13 are disposed close to each other.

In a plan view of the multilayer substrate 80, the second output terminals (terminals 121, 122, 131, and 132) are disposed farther inward than the second input terminals (terminals 123 through 125 and 133 through 137) in the switch region.

In this description, the meaning of "a certain terminal is disposed farther inward" is that the certain terminal is spaced farther from the peripheral sides of the multilayer substrate 80, in a plan view of the multilayer substrate 80.

With this configuration, it is possible to avoid a situation where the terminals 121 through 125 and 131 through 137 are densely arranged on the peripheral sides of the switch region. It is thus possible to significantly reduce or prevent the deterioration of isolation which would be caused by the arrangement in which the terminals of the first output switch 12 are disposed close to each other and the terminals of the second output switch 13 are disposed close to each other.

In a plan view of the multilayer substrate 80, the ground terminals 119 are disposed between the first output terminals (terminals 112 through 116) and the second output terminals (terminals 121, 122, 131, and 132).

With this configuration, it is possible to significantly reduce or prevent the deterioration of isolation between the terminals 112 through 116 and the terminals 121, 122, 131, and 132 due to the electromagnetic shielding effect exhibited by the ground terminals 119.

In a plan view of the multilayer substrate 80, the second input terminals (terminals 123 through 125) and the second output terminals (terminals 121 and 122) of the first output switch 12 are disposed close to one side (left side in FIG. 2) of the switch region, while the second input terminals (terminals 133 through 137) and the second output terminals (terminals 131 and 132) of the second output switch 13 are disposed on another side (right or bottom side in FIG. 2) of the switch region.

With this configuration, it is possible to significantly reduce or prevent the deterioration of isolation which would be caused by the arrangement in which the terminals 121 through 125 and the terminals 131 through 137 are disposed close to each other.

In the multilayer substrate 80, the wiring patterns (wiring patterns 51 and 52 indicated by the thick solid lines and the thick dotted lines, respectively, in FIG. 2) connected to the first input terminal (terminal 111), the first output terminals (terminals 112 through 116), and the second input terminals (terminals 123 through 125 and 133 through 137) are disposed on the first wiring layer (upper main surface 501 and boundary surface 502). The wiring patterns (wiring patterns 54 indicated by the thick dashed lines in FIG. 2) connected to the second output terminals (terminals 121, 122, 131, and 132) are disposed on the second wiring layer (boundary surface 504). The ground conductors 53 are disposed on the boundary surface 503 between the first and second wiring layers.

With this configuration, it is possible to significantly reduce or prevent the deterioration of isolation between the second output terminal and each of the first input terminal, the first output terminal, and the second input terminal due to the electromagnetic shielding effect exhibited by the ground conductors 53. The wiring patterns connected to the first input terminal, the first output terminal, and the second input terminal are not disposed on the second wiring layer, while the wiring patterns connected to the second output terminal are not disposed on the first wiring layer. With this configuration, the deterioration of the above-described isolation is reliably significantly reduced or prevented.

Wiring patterns connected to different second output terminals (terminals 121 and 122) and extending in different directions, and more specifically, a wiring pattern which connects the terminals 121 and 41 and a wiring pattern which connects the terminals 122 and 42, are provided.

With this configuration, since the wiring pattern connected to the terminal 121 and the wiring pattern connected to the terminal 122 extend in different directions, they are less likely to be close to each other. Accordingly, the deterioration of isolation between the terminals 121 and 122 is significantly reduced or prevented. A wiring pattern connected to the terminal 131 and a wiring pattern connected to the terminal 132 also extend in different directions. Accordingly, the deterioration of isolation between the terminals 131 and 132 is also significantly reduced or prevented.

The input switch 11 and the first and second output switches 12 and 13 preferably are defined by a single semiconductor chip (switch IC 10) disposed at or substantially at the center of the multilayer substrate 80. The switch region is defined by the outer configuration of the switch IC 10. The filters 21 through 28 are disposed in regions which surround the switch IC 10, in a plan view of the multilayer substrate 80.

With this configuration, plural wiring patterns are disposed radially or substantially radially between the switch IC 10 and the filters 21 through 28. Accordingly, the plural wiring patterns are more likely to be separated from each other by a sufficient distance, thus significantly reducing or preventing the deterioration of isolation between the plural wiring patterns.

Test results of measuring isolation by using a prototype of the front-end module 1 will be discussed below.

Figure 4:
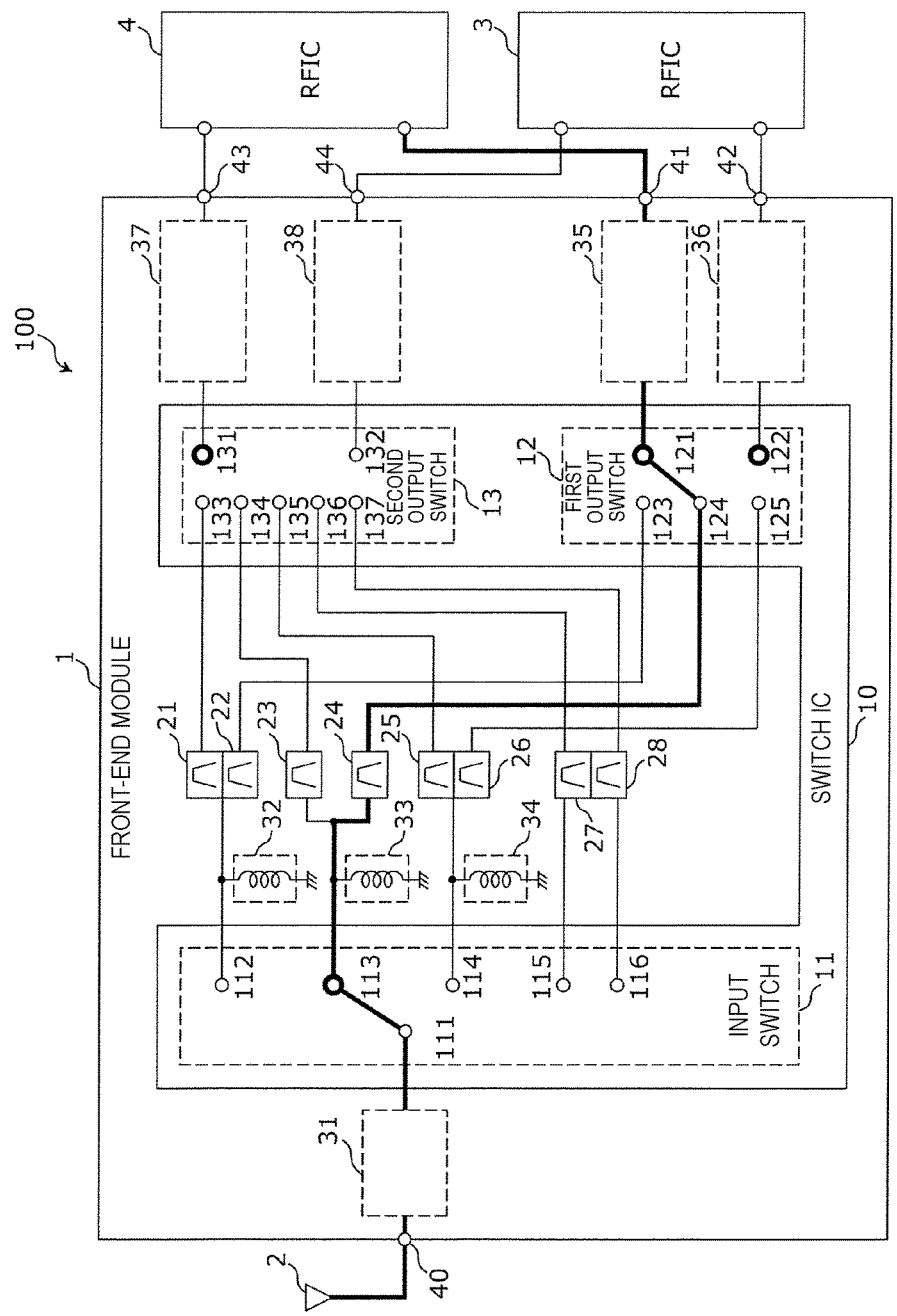
FIG. 4 is a circuit diagram illustrating examples of isolation measuring points in the first preferred embodiment of the present invention.

FIG. 4 is a circuit diagram illustrating examples of isolation measuring points in this test. In this test, the connection states of the input switch 11 and the first and second output switches 12 and 13 were set as shown in FIG. 4. That is, the terminals 111 and 113 were connected (shorted) and the terminals 121 and 124 were connected (shorted), while all the other terminals were opened. In this state, a measuring signal was applied to the signal path indicated by the solid line in FIG. 4, and isolation between the terminals 121 and 113, between the terminals 122 and 121, and between the terminals 131 and 121 was measured. The measuring signal was applied in a range of about 850 MHz to about 1050 MHz including the 900 MHz band (about 925 MHz to about 958 MHz) which was assumed as the operating band.

Figure 5A:
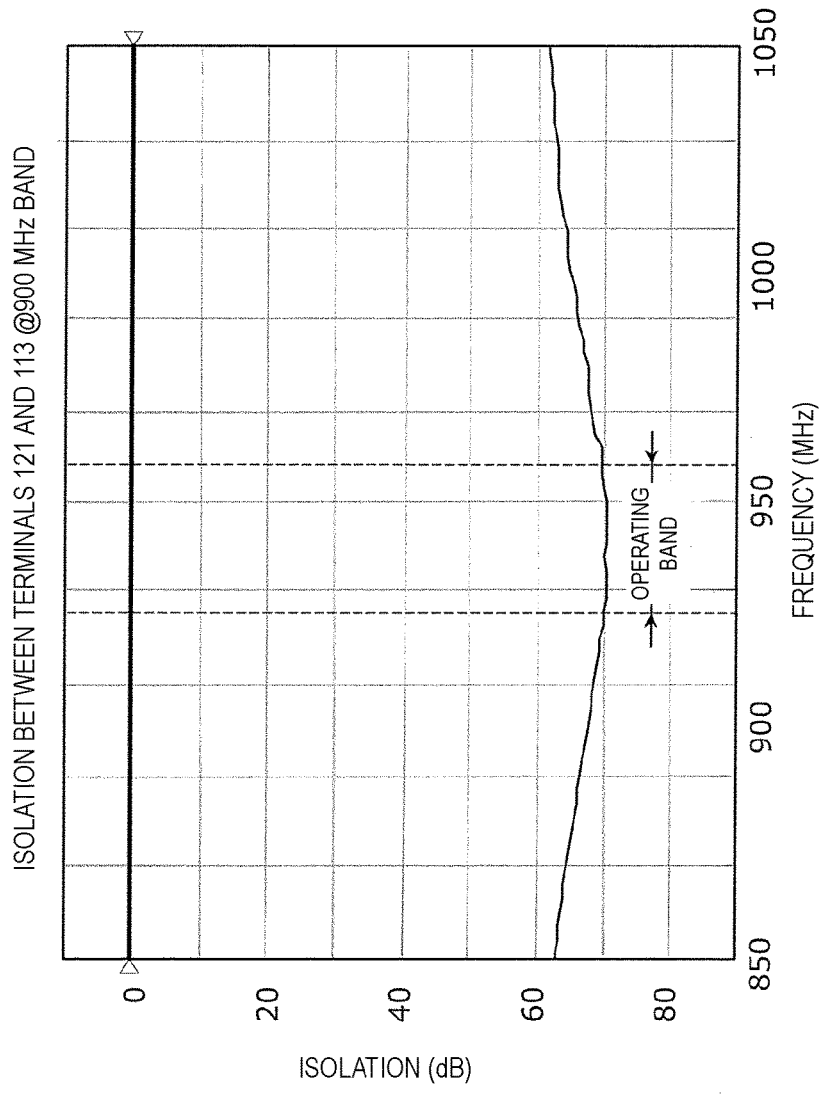
FIGS. 5A, 5B, and 5C show graphs representing examples of isolation measurement results in the first preferred embodiment of the present invention.
Figure 5B:
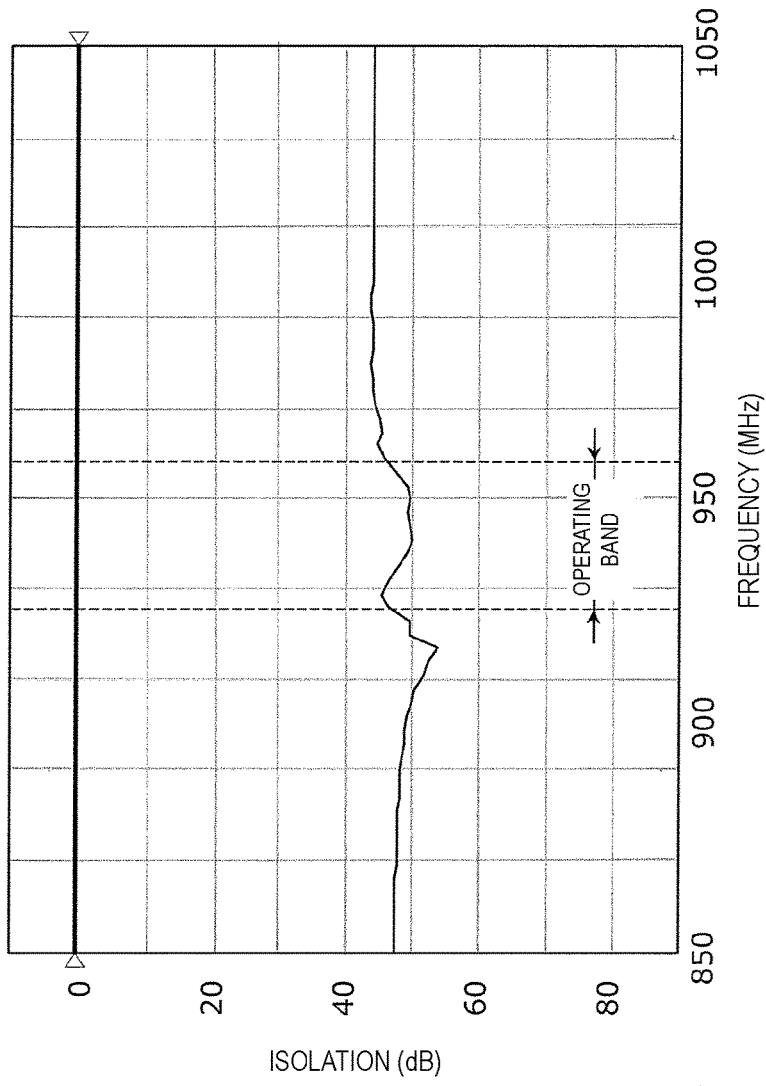
Figure 5C:
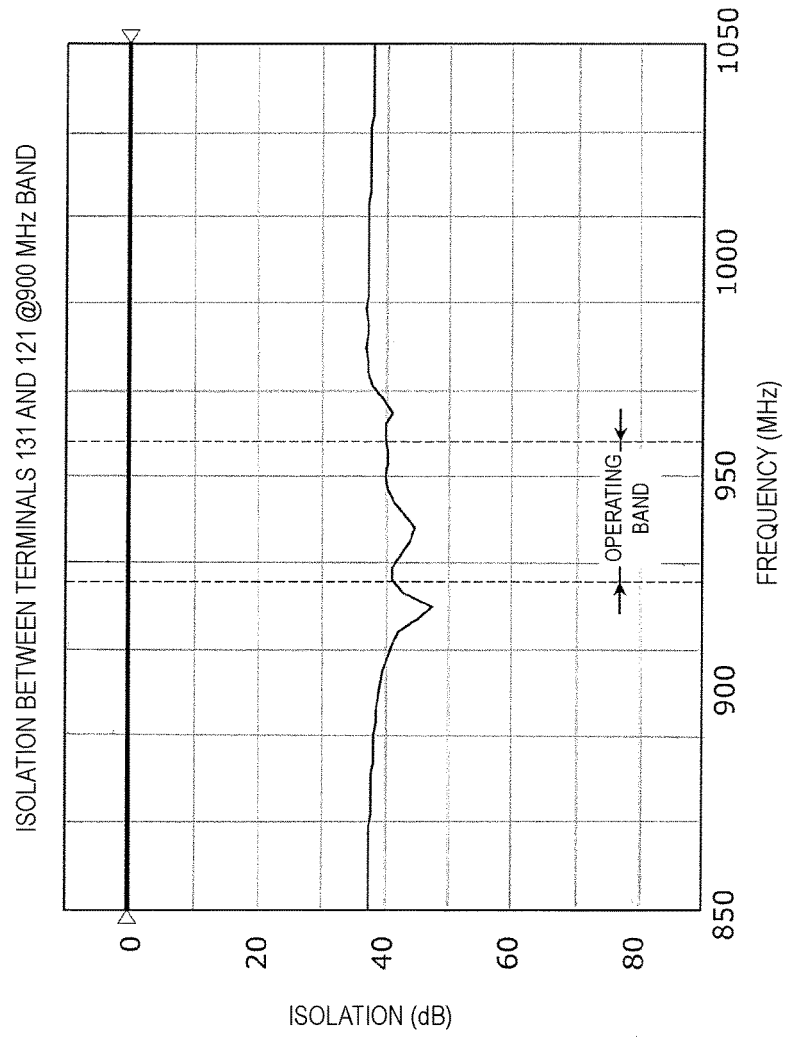

FIGS. 5A, 5B, and 5C show graphs representing examples of the isolation measured between the terminals 121 and 113, between the terminals 122 and 121, and between the terminals 131 and 121, respectively.

As shown in FIGS. 5A, 5B, and 5C, isolation exceeding about 40 dB was measured within the operating band in any of the points between the terminals 121 and 113, between the terminals 122 and 121, and between the terminals 131 and 121.

The cellular phone 100 including the front-end module 1 will now be described below.

Figure 6:
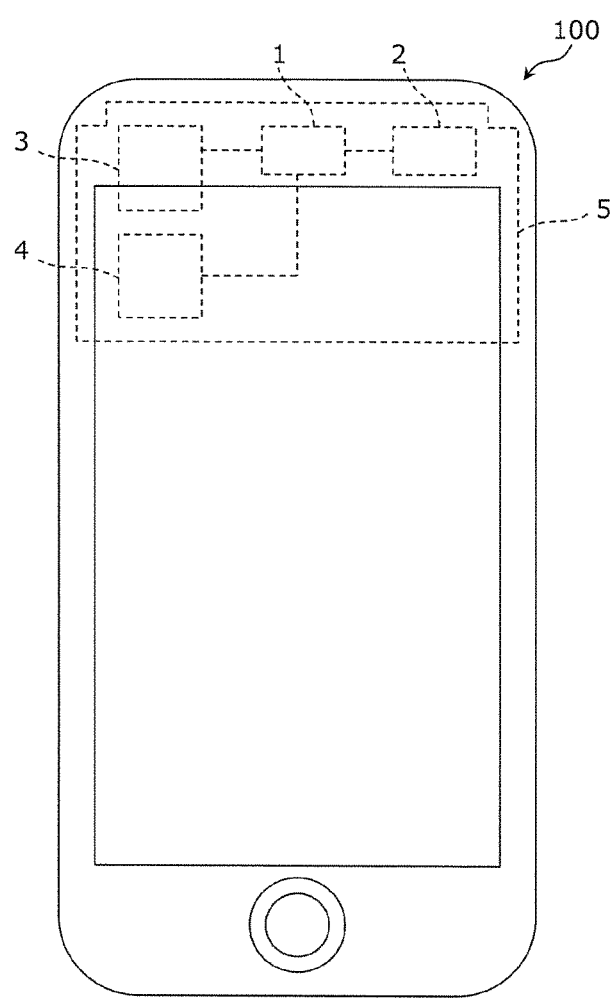
FIG. 6 is a plan view illustrating an example of the configuration of a communication device according to the first preferred embodiment of the present invention.

FIG. 6 is a plan view illustrating an example of the configuration of the cellular phone 100. In FIG. 6, the internal positions of the front-end module 1, the antenna 2, and the RFICs 3 and 4 are shown, together with the schematic external appearance of the cellular phone 100. The front-end module 1, the antenna 2, and the RFICs 3 and 4 are mounted on a wiring substrate 5 and are stored within the cellular phone 100.

With this configuration, by using the front-end module 1 in which the deterioration of the above-described various kinds of isolation is significantly reduced or prevented, the cellular phone 100 exhibiting excellent signal characteristics is obtained.

Second Preferred Embodiment

A radio-frequency module according to a second preferred embodiment of the present invention includes plural signal paths and switches to select at least one of the plural signal paths. The radio-frequency module is, for example, a front-end module used in a multiband communication device such as a cellular phone. In this front-end module, some of the matching circuits and the carrier aggregation functions provided in the front-end module 1 of the first preferred embodiment are removed, and the number of operating bands is also reduced.

The second preferred embodiment describes that some features of the front-end module 1 discussed in the first preferred embodiment are applied to a simpler front-end module and some advantages are achieved. In the second preferred embodiment, the same elements as those of the first preferred embodiment are designated by like reference numerals, and thus, an explanation thereof will be omitted, and points different from the first preferred embodiment will mainly be discussed below.

Figure 7:
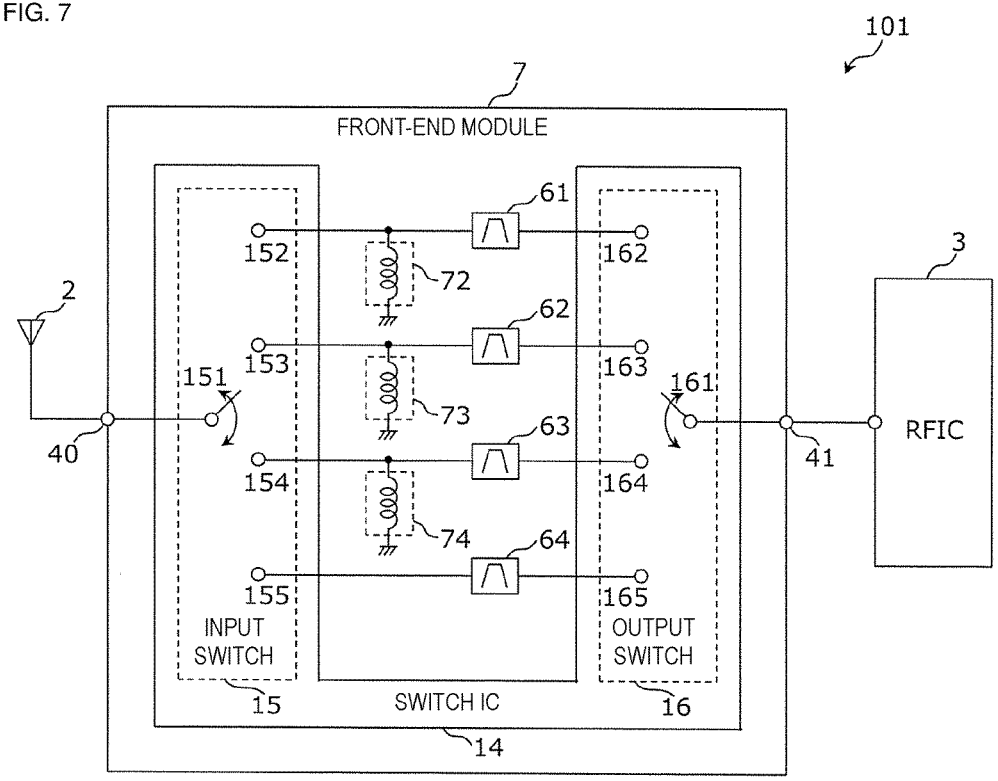
FIG. 7 is a circuit diagram illustrating an example of the circuit configuration of a front-end module according to a second preferred embodiment of the present invention.

FIG. 7 is a circuit diagram illustrating an example of the circuit configuration of a front-end module 7 according to the second preferred embodiment. In FIG. 7, as the major portion of a cellular phone 101, an antenna 2 and an RFIC 3 are shown, together with the front-end module 7.

The front-end module 7 is different from the front-end module 1 shown in FIG. 1A in that the matching circuits 31 and 35 through 38 and the terminals 42 through 44 are omitted and a switch IC 14, filters 61 through 64, and matching circuits 72 through 74 are different from the counterparts of the front-end module 1.

The terminal 40 receives a radio signal from the antenna 2. It is assumed that this radio signal includes signals of four bands which are operated in multiband communication.

The switch IC 14 preferably is a one-chip IC including an input switch 15 and an output switch 16. The connection states of the input switch 15 and the output switch 16 are changed in the following manner in accordance with a selection signal received by a control terminal (not shown).

The input switch 15 includes terminals 151 through 155, and connects the terminal 151 to one terminal selected from the terminals 152 through 155. The terminal 151 is an example of a first input terminal, while the terminals 152 through 155 are examples of a first output terminal.

The output switch 16 includes terminals 161 through 165, and connects the terminal 161 to one terminal selected from the terminals 162 through 165. The terminals 162 through 165 are examples of a second input terminal, while the terminal 161 is an example of a second output terminal.

The filters 61 through 64 are band pass filters which allow signals of the four different bands to pass therethrough, and are connected to the associated output terminals of the input switch 15 and to the associated input terminals of the output switch 16. The filter 61 is preferably defined by a filter component in which a single filter element is stored in one package. The filters 62 through 64 are also constructed in a similar manner.

The matching circuit 72 is disposed on a signal path between the terminal 152 and the filter 61.

The matching circuit 73 is disposed on a signal path between the terminal 153 and the filter 62.

The matching circuit 74 is disposed on a signal path between the terminal 154 and the filter 63.

The configurations of the matching circuits 72 through 74 are not particularly restricted. Each of the matching circuits 72 through 74 may be defined by one inductor.

In the front-end module 7 configured as described above, signals of individual bands are separated by the filters 61 through 64 from a multiband signal received by the terminal 40. Then, one signal is selected from among the separated signals in accordance with the connection states of the input switch 15 and the output switch 16, and is output to the terminal 41.

FIG. 8 is a plan view illustrating an example of the arrangement of components of the front-end module 7. In the front-end module 7, the switch IC 14, filter components of the filters 61 through 64, and inductors of the matching circuits 72 through 74 are mounted on the upper main surface of a multilayer substrate 81.

In FIG. 8, the positions of the terminals of the input switch 15 and the output switch 16 are expressed by the same symbols as those in FIG. 7. Terminals 159 and 169 indicated by the hatched portions are ground terminals of the input switch 11 and the output switch 16, respectively, and are not shown in FIG. 7.

An explanation of the representation of the wiring patterns and a modified example which may be applied to the switch IC 14 shown in FIG. 8 is the same as that discussed with reference to FIG. 2, and will thus be omitted here. The multilayer substrate 81 may include four base layers including a ground layer, as in the multilayer substrate 80 shown in FIG. 3.

Advantages of the front-end module 7 configured as described above will be discussed below.

On the upper main surface of the multilayer substrate 81, a substantially polygonal (for example, substantially rectangular) switch region (for example, the outer configuration of the switch IC 14) is disposed. In a plan view of the multilayer substrate 81, the first input terminal (terminal 151) and the first output terminals (terminals 152 through 155) are disposed close to a first side (top side in FIG. 8) of the switch region. The second input terminals (terminals 162 through 165) and the second output terminal (terminal 161) are disposed close to a second side (bottom side in FIG. 8), which is different from the first side, of the switch region. The definition of "a certain terminal is disposed close to a certain side of the switch region" is similar to that discussed in the first preferred embodiment.

With this configuration, the terminals of the input switch 15 are disposed close to one side of the switch region, while the terminals of the output switch 16 are disposed close to another side of the switch region. Accordingly, even if the size of the switch region is reduced in accordance with a decrease in the size of the front-end module 7, the terminals of the input switch 15 and the terminals of the output switch 16 are more likely to be separated from each other. It is thus possible to significantly reduce or prevent the deterioration of isolation which would be caused by the arrangement in which the terminals of the input switch 15 and the terminals of the output switch 16 are disposed close to each other.

In a plan view of the multilayer substrate 81, the ground terminals 159 and 169 are disposed between the first output terminals (terminals 152 through 155) and the second output terminal (terminal 161).

With this configuration, it is possible to significantly reduce or prevent the deterioration of isolation between the terminals 152 through 155 and the terminal 161 due to the electromagnetic shielding effect exhibited by the ground terminals 159 and 169.

As is seen from the foregoing description, some features of the front-end module 1 discussed in the first preferred embodiment are applied to the simpler front-end module 7, and similar advantages are achieved.

Modified Examples

The radio-frequency modules according to the above-described preferred embodiments have been discussed through illustration of a front-end module. However, the present invention is not restricted to the above-described preferred embodiments. The elements in the above-described preferred embodiments may be combined in any manner to realize other modes, and various modifications apparent to those skilled in the art may be made to the embodiments without departing from the scope and spirit of the present invention to realize other preferred embodiments. Such other preferred embodiments of are encompassed within the present invention.

Preferred embodiments of the present invention are widely applicable to a communication device, as a radio-frequency module such as a front-end module.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency module, comprising:
a substrate including a switch region provided on a main surface thereof;
an input switch in the switch region of the substrate and including a first input terminal and a first output terminal;
an output switch in the switch region of the substrate and including a second input terminal and a second output terminal; and
a filter outside the switch region of the substrate and connected to the first output terminal or the second input terminal; wherein
in a plan view of the substrate, the second output terminal is farther inward than the second input terminal in the switch region such that a distance between the second input terminal and an outer configuration of the switch region is shorter than a distance between the second output terminal and the outer configuration of the switch region.

2. The radio-frequency module according to claim 1, wherein, in a plan view of the substrate, the first input terminal and the first output terminal are disposed close to a first side of the switch region, and the second input terminal and the second output terminal are disposed close to a second side, which is different from the first side, of the switch region.

3. The radio-frequency module according to claim 1, wherein, in a plan view of the substrate, a ground terminal is between the first output terminal and the second output terminal.

4. The radio-frequency module according to claim 1, wherein
the output switch includes a plurality of output switches, each of the plurality of output switches including the second input terminal and the second output terminal; and
in a plan view of the substrate, the second input terminal and the second output terminal of the first output switch are disposed close to one side of the switch region, and the second input terminal and the second output terminal of the second output switch are disposed close to another side of the switch region.

5. The radio-frequency module according to claim 1, wherein
the substrate is a multilayer substrate including first and second wiring layers;
a wiring pattern connected to at least one of the first input terminal, the first output terminal, and the second input terminal is disposed on the first wiring layer;
a wiring pattern connected to the second output terminal is disposed on the second wiring layer; and
a ground conductor is between the first and second wiring layers.

6. The radio-frequency module according to claim 5, wherein the multilayer substrate includes a plurality of base layers stacked on each other and wiring conductors disposed on the base layers.

7. The radio-frequency module according to claim 1, wherein
the second output terminal includes a plurality of second output terminals,
the radio-frequency module further includes a plurality of wiring patterns connected to different second output terminals of the plurality of second output terminals and extend in different directions.

8. The radio-frequency module according to claim 1, wherein
the input switch and the output switch are defined by a single semiconductor chip disposed at or substantially at a center of the substrate;
the switch region is defined by an outer configuration of the semiconductor chip; and
the filter is disposed in a region which surrounds the semiconductor chip, in a plan view of the substrate.

9. The radio-frequency module according to claim 1, wherein the radio-frequency module is a front-end module.

10. The radio-frequency module according to claim 1, wherein the input switch and the output switch are included in a one-chip integrated circuit.

11. The radio-frequency module according to claim 1, wherein the filter is a band pass filter.

12. The radio-frequency module according to claim 1, further comprising a plurality of matching circuits.

13. The radio-frequency module according to claim 1, wherein the output switch includes a plurality of output switches, and the plurality of output switches and the input switch are defined by a single semiconductor chip.

14. A communication device comprising:
the radio-frequency module according to claim 1; and
a radio-frequency integrated circuit connected to the radio-frequency module.

15. The communication device according to claim 14, wherein the communication device is a cellular phone.

16. The communication device according to claim 14, wherein the radio-frequency module is a front-end module.

17. The communication device according to claim 14, further comprising an antenna and an RFIC.

18. The communication device according to claim 14, wherein the input switch and the output switch are defined by a one-chip integrated circuit.

19. The communication device according to claim 14, further comprising matching circuits.

* * * * *